United States Patent
Kanzaki et al.

(12) 
(10) Patent No.: US 6,197,134 B1
(45) Date of Patent: Mar. 6, 2001

(54) PROCESSES FOR PRODUCING FCC METALS

(75) Inventors: Toshihiro Kanzaki; Fumi Tanabe, both of Shizuoka (JP)

(73) Assignee: Dowa Mining Co., Ltd., Tokyo (JP)

( * ) Notice: Subject to any disclaimer, the term of this patent is extended or adjusted under 35 U.S.C. 154(b) by 0 days.

(21) Appl. No.: 09/408,384

(22) Filed: Sep. 29, 1999

Related U.S. Application Data

(62) Division of application No. 08/780,597, filed on Jan. 8, 1997.

(51) Int. Cl.$^7$ .............................................. C22F 1/08
(52) U.S. Cl. .......................... 148/682; 148/684; 148/685
(58) Field of Search ................................. 148/681, 682, 148/684, 688

(56) References Cited

U.S. PATENT DOCUMENTS

| | | | |
|---|---|---|---|
| 5,316,802 | 5/1994 | Ebe et al. | 427/533 |
| 5,643,679 | 7/1997 | Ishimaru et al. | 428/472 |

FOREIGN PATENT DOCUMENTS

| | | |
|---|---|---|
| 62-089853 | 4/1987 | (JP) . |
| 63-200406 | 8/1988 | (JP) . |
| 03208891 | 9/1991 | (JP) . |
| 05051712 | 3/1993 | (JP) . |
| 07086325 | 3/1995 | (JP) . |
| 62-089348 | 4/1997 | (JP) . |

OTHER PUBLICATIONS

Ray, R.K. Development of annealing textures in copper and copper phosphorous alloys, Trans. Indian Inst. Met. (1983), 36(6), 471–3 (enclosed abstract only) 1983.*
*Fujiwara, S.; Abiko, K,M "Ductibility of ultra high purity copper", *J. Phys. IV*, (1995), 5 (C7), abstract only.
*Merz, M.D.; Dahlgren, S.D., "Tensile strength and work hardening of ultrafine–grained high–quality copper", *J. Appl. Phys.*, (1975), 46 (8), abstract only.
*Johanneson, T.; Tholen, A., "High temperature deformation in polycrystalline copper", *Jerkontorets Ann.*, (1970), 154 (7), abstract only.
*Ledbetter, Hassel; Fortunko, Christopher; Heyliger, Paul, "Elastic constants and internal friction of polycrystalline copper", *J. Mater. Res.*, (1995), 10 (6), abstract only.

* cited by examiner

*Primary Examiner*—Sikyin Ip
(74) *Attorney, Agent, or Firm*—Frishauf, Holtz, Goodman, Langer & Chick, P.C.

(57) ABSTRACT

A process for producing a fcc metal consisting of copper having random orientations comprising cross rolling which is performed to achieve a total draft of at least 20% with the rolling axis being offset at 15° or more in each pass to a total offset of at least 90°, and subsequent full annealing which is accompanied by recrystallization, the fcc metal satisfying the following relationships: $I_{(200)}/I_{(111)} \leq 2.3$ and $I_{(220)}/I_{(111)} \leq 1.0$, where $I_{(111)}$, $I_{(200)}$ and $I_{(220)}$ are the integral intensities of the (111), (200) and (220) faces, respectively, of crystal faces as measured by X-ray diffractiometry.

10 Claims, No Drawings

PROCESSES FOR PRODUCING FCC METALS

This application is a division of application Ser. No. 08/780,597, filed Jan. 8, 1997.

BACKGROUND OF THE INVENTION

This invention relates to fcc metals, or metals having a face-centered cubic lattice, which are controlled in crystal orientation to be suitable for use as target materials. The invention also relates to a process for producing such fcc metals.

With the recent development of the electronic industry, the use of sputtering target materials has increased and there is also a demand for improving their characteristics.

To provide metallization films on substrate wafers by sputtering, fcc metals are conventionally employed and required to have the following characteristics.

(1) They should have controlled specific crystal orientations, which depend on the property to be possessed by the fcc metal to be sputtered:
  (i) In order to assure uniformity in the sputter film, it is particularly desired that the fcc metal have random orientations;
  (ii) In order to assure high directivity in sputtering, it is particularly desired that the fcc metal be dominantly (110) oriented.
  (iii) In order to assure high sputtering rate and uniformity in the sputter film, it is particularly desired that the fcc metal be dominantly (100) oriented.

(2) The fcc metal should also have good electromigration characteristics. As the line width of metallization or conductor films formed by sputtering on substrate wafers decreases, electromigration which is a kind of "breaking of wire" phenomenon has become a problem. It has been established that the phenomenon of electromigration is largely affected by the composition of the sputter film and, therefore, sputtering target materials which determine the compositions of sputter films in an almost unique way should also have good electromigration characteristics.

(3) The fcc metal should have minimum levels of impurities. The reliability of conductors formed of sputter films is largely affected by their microstructure which, in turn, is largely affected by impurities including gaseous components. It is therefore desired that sputtering target materials should also have minimum levels of impurities other than specified components.

(4) The fcc metal should have fine average crystal grain sizes. In order to enhance the uniformity of sputter films, as well as to improve the sputtering rate and directivity, it is desired that sputtering target materials have fine average crystal grain sizes.

Aluminum and any other materials that have heretofore been used to form metallization films by sputtering on substrate wafers do not satisfy the required characteristics to the fullest extent.

SUMMARY OF THE INVENTION

An object, therefore, of the invention is to provide fcc metals that are controlled to have desired crystal orientations and which possess all of the characteristics required for sputtering target materials.

Another object of the invention is to provide processes for producing such improved fcc metals.

The present inventors conducted intensive studies with a view to attaining the stated objects and found that when fcc metals, particularly those having a Cu matrix, were subjected to appropriate working and heat treatments such that they were controlled to have optimal crystal orientations in accordance with a specific object, they could be rendered to be satisfactory as sputtering target materials. The present invention has been accomplished on the basis of this finding.

Thus, according to a first aspect of the invention, there is provided a fcc metal having random orientations which satisfies the relations:

$I_{(200)}/I_{(111)} \leq 2.3$ and $I_{(220)}/I_{(111)} \leq 1.0$ where $I_{(200)}$ and $I_{(220)}$ are the integral intensities of (111), (200) and (220) faces, respectively, of crystal faces as measured by X-ray diffractiometry.

According to a second aspect of the invention, there is provided a fcc metal according to the first aspect which is a metal having a copper matrix.

According to a third aspect of the invention, there is provided a fcc metal according to the second aspect, wherein the copper has a purity of at least 99.9999% (6 nines).

According to a fourth aspect of the invention, there is provided a fcc metal according to the second aspect which has an average crystal grain size of no more than 200 μm.

According to a fifth aspect of the invention, there is provided a fcc metal having random orientations which has a copper matrix with a purity of at least 6 nines and an average crystal grain size of no more than 200 μm and which further satisfies the relations:

$I_{(200)}/I_{(111)} \leq 2.3$ and $I_{(220)}/I_{(111)} \leq 1.0$ where $I_{(200)}$ and $I_{(220)}$ are the integral intensities of (111), (200) and (220) faces, respectively, of crystal faces as measured by X-ray diffractiometry.

According to a sixth aspect of the invention, there is provided a process for producing a fcc metal having random orientations comprising the steps of cross rolling which is performed to achieve a total draft of at least 20%, with the rolling axis being offset at 15° or more in each pass to a total offset of at least 90°, and subsequent full annealing which is accompanied by recrystallization, said fcc metal satisfying the relations:

$I_{(200)}/I_{(111)} \leq 2.3$ and $I_{(200)}/I_{(111)} \leq 1.0$ where $I_{(111)}$, $I_{(200)}$ and $I_{(220)}$ are the integral intensities of (111), (200) and (220) faces, respectively, of crystal faces as measured by X-ray diffractiometry.

According to a seventh aspect of the invention, there is provided a process for producing a fcc metal having a copper matrix and random orientations comprising the steps of cross rolling which is performed to achieve a total draft of at least 20%, with the rolling axis being offset at 15° or more in each pass to a total offset of at least 90°, and subsequent heat treatment which is performed at 493–823 K for 60–7,200 seconds, said fcc metal satisfying the relations:

$I_{(200)}/I_{(111)} \leq 2.3$ and $I_{(220)}/I_{(111)} \leq 1.0$ where $I_{(111)}$, $I_{(200)}$ and $I_{(220)}$ are the integral intensities of (111), (200) and (220) faces, respectively, of crystal faces as measured by X-ray diffractiometry.

According to an eighth aspect of the invention, there is provided a process for producing a fcc metal according to the seventh aspect, wherein the copper has a purity of at least 6 nines.

According to a ninth aspect of the invention, there is provided a process for producing a fcc metal according to the seventh aspect, said fcc metal having an average crystal grain size of no more than 200 μm and random orientations, said process comprising the steps of performing hot working at 623–873 K to a reduction ratio of at least 20%, performing at least twice each of cold working to a reduction ratio of at least 10% and a heat treatment at 493–823 K for 60–7,200 seconds followed by cross rolling which is performed to achieve a total draft of at least 20%, with the rolling axis being offset at 15° or more in each pass to a total offset of at least 90° and subsequent heat treatment which is performed at 493–823 K for 60–7,200 seconds.

According to a tenth aspect of the invention, there is provided a target material comprising a fcc metal having random orientations which is defined by any one from the first aspect to the fifth aspect.

According to an eleventh aspect of the invention, there is provided a target material comprising a fcc metal having random orientations which has been produced by the process of any one from the sixth aspect to the ninth aspect.

According to a twelfth aspect of the invention, there is provided a fcc metal having a dominant (110) orientation which satisfies the relation:

$$I_{(220)}/I_{(111)} \geq 2.0$$

where $I_{(111)}$ and $I_{(220)}$ are the integral intensities of (111) and (220) faces, respectively, of crystal faces as measured by X-ray diffractiometry.

According to a thirteenth aspect of the invention, there is provided a fcc metal according to the twelfth aspect which is a metal having a copper matrix.

According to a fourteenth aspect of the invention, there is provided a fcc metal according to the thirteenth aspect, wherein the copper has a purity of at least 99.9999% (6 nines).

According to a fifteenth aspect of the invention, there is provided a fcc metal according to the thirteenth aspect which has an average crystal grain size of no more than 200 μm.

According to a sixteenth aspect of the invention, there is provided a fcc metal having a dominant (110) orientation which has a copper matrix with a purity of at least 6 nines and an average crystal grain size of no more than 200 μm and which further satisfies the relation:

$$I_{(220)}/I_{(111)} \geq 2.0$$

where $I_{(111)}$ and $I_{(220)}$ are the integral intensities of (111) and (220) faces, respectively, of crystal faces as measured by X-ray diffractiometry.

According to a seventeenth aspect of the invention, there is provided a process for producing a fcc metal having a dominant (110) orientation comprising the steps of cross rolling which is performed to achieve a total draft of at least 20%, with the rolling axis being offset at 15° or more in each pass to a total offset of at least 90°, and subsequent stress-relief annealing which is not accompanied by recrystallization, said fcc metal satisfying the relation:

$$I_{(220)}/I_{(111)} \geq 2.0$$

where $I_{(111)}$ and $I_{(220)}$ are the integral intensities of (111) and (220) faces, respectively, of crystal faces as measured by X-ray diffractiometry.

According to an eighteenth aspect of the invention, there is provided a process for producing a fcc metal according to the seventeenth aspect, said fcc metal having a copper matrix and a dominant (110) orientation, said process comprising the steps of cross rolling which is performed to achieve a total draft of at least 20%, with the rolling axis being offset at 15° or more in each pass to a total offset of at least 90°, and subsequent heat treatment which is performed at 348–473 K for 300–36,000 seconds.

According to a nineteen aspect of the invention, there is provided a process for producing a fcc metal according to the eighteenth aspect, wherein the copper has a purity of at least 6 nines.

According to a twentieth aspect of the invention, there is provided a process for producing a fcc metal according to the seventeenth aspect, said fcc metal having an average crystal grain size of no more than 200 μm and a dominant (110) orientation, said process comprising the steps of performing hot working at 623–873 K to a reduction ratio of at least 20%, performing at least twice each of cold working to a reduction ratio of at least 10% and a heat treatment at 493–823 K for 60–7,200 seconds and cross rolling which is performed to achieve a total draft of at least 20%, with the rolling axis being offset at 15° or more in each pass to a total offset of at least 90°, and subsequent heat treatment which is performed at 348–473 K for 300–36,000 seconds.

According to a twenty-first aspect of the invention, there is provided a target material comprising a fcc metal having a dominant (110) orientation which is defined by any one from the twelfth aspect to the sixteenth aspect.

According to a twenty-second aspect of the invention, there is provided a target material comprising a fcc metal having a dominant (110) orientation which has been produced by the process of any one from the seventeenth aspect to the twentieth aspect.

According to a twenty-third aspect of the invention, there is provided a fcc metal having a dominant (100) orientation which satisfies the relations:

$$I_{(200)}/I_{(111)} \geq 4.6$$

where $I_{(111)}$ and $I_{(200)}$ are the integral intensities of (111) and (200) faces, respectively, of crystal faces as measured by X-ray diffractiometry.

According to a twenty-fourth aspect of the invention, there is provided a fcc metal according to the twenty-third aspect which is a metal having a copper matrix.

According to a twenty-fifth aspect of the invention, there is provided a fcc metal according to the twenty-fourth aspect, wherein the copper has a purity of at least 99.9999% (6 nines).

According to a twenty-sixth aspect of the invention, there is provided a fcc metal according to the twenty-fourth aspect which has an average crystal grain size of no more than 200 μm.

According to a twenty-seventh aspect of the invention, there is provided a fcc metal having a dominant (100) orientation which has a copper matrix with a purity of at least 6 nines and an average crystal grain size of no more than 200 μm and which further satisfies the relation:

$$I_{(200)}/I_{(111)} \geq 4.6$$

where $I_{(111)}$ and $I_{(200)}$ are the integral intensities of (111) and (200) faces, respectively, of crystal faces as measured by X-ray diffractiometry.

According to a twenty-eighth aspect of the invention, there is provided a process for producing a fcc metal having a dominant (100) orientation comprising the steps of one-way or reciprocal rolling which is performed to a total draft of at least 20%, with the offset of the rolling axis for all passes being controlled to be less than ±15° and subsequent full annealing which is accompanied by recrystallization, said fcc metal satisfying the relation:

$$I_{(200)}/I_{(111)} \geq 4.6$$

where $I_{(111)}$ and $I_{(200)}$ are the integral intensities of (111) and (200) faces, respectively, of crystal faces as measured by X-ray diffractiometry.

According to a twenty-ninth aspect of the invention, there is provided a process for producing a fcc metal according to the twenty-eighth aspect, said fcc metal having a copper matrix and a dominant (100) orientation, said process comprising the steps of one-way or reciprocal rolling which is performed to a total draft of at least 20%, with the offset of rolling axis for all passes being controlled to be less than ±15°, and subsequent heat treatment which is performed at 493–823 K for 60–7,200 seconds.

According to a thirtieth aspect of the invention, there is provided a process for producing a fcc metal according to the twenty-ninth aspect, wherein the copper has a purity of at least 6 nines.

According to a thiry-first aspect of the invention, there is provided a process for producing a fcc metal according to the twenty-eighth aspect, said fcc metal having an average crystal grain size of no more than 200 μm and a dominant (100) orientations, said process comprising the steps of performing hot working at 623–873 K to a reduction ratio of at least 20%, performing at least twice each of cold working to a reduction ratio of at least 10% and a heat treatment at 493–823 K for 60–7,200 seconds, followed by one-way or reciprocal rolling which is performed to a total draft of at least 20%, with the offset of the rolling axis for all passes being controlled to be less than ±15° and subsequent heat treatment at 493–823 K for 60–7,200 seconds.

According to a thirty-second aspect of the invention, there is provided a target material comprising a fcc metal having a dominant (100) orientation which is defined by any one from the twenty-third aspect to the twenty-seventh aspect.

According to a thirty-third aspect of the invention, there is provided a target material comprising a fcc metal having a dominant (100) orientation which has been produced by the process of any one from the twenty-eighth aspect to the thiry-first aspect.

The heart of the present invention lies on the fact that fcc metals are subjected to appropriate working and heat treatments such that their crystal orientations are controlled to make them suitable for use as sputtering target materials and the like.

The criticalities of the fcc metals and the processes for producing them according to the various aspects of the invention will now be described below in detail.

Crystal orientations

The fcc metals of the invention should satisfy one of the following three requirements depending on the specific character to be provided.

(1) In order to assure uniformity in sputter films, the fcc metals for use as sputtering target materials have desirably random orientations, which are evaluated by the integral intensities of (200) and (220) faces as relative to the integral intensity of a (111) face as measured by X-ray diffractiometry. If $I_{(200)}/I_{(111)}$ is greater than 2.3 or if $I_{(220)}/I_{(111)}$ is greater than 1.0, the orientations of crystal faces of the fcc metal cannot be regarded as being "random" and the film produced by sputtering will be deteriorated in uniformity. Therefore, the fcc metal that can be sputtered to produce a uniform film should satisfy the following relations: $I_{(200)}/I_{(111)} \leq 2.3$ and $I_{(200)}/I_{(111)} \leq 1.0$.

(2) In order to assure high directivity in sputtering, the fcc metals for use as sputtering target material have desirably a dominant (110) orientation, which is evaluated by the integral intensities of (220) face as relative to that of a (111) face as measured by X-ray diffractiometry. If $I_{(220)}/I_{(111)}$ smaller than 2.0, the (110) orientation cannot be regarded as being "dominant" and the directivity in sputtering will deteriorate. Therefore, the fcc metal that can be sputtered with high directivity should satisfy the following relation: $I_{(200)}/I_{(111)} \geq 2.0$.

(3) In order to assure high sputtering rate and uniformity in the sputter film, the fcc metals for use as sputtering target materials have desirably a dominant (100) orientation, which is evaluated by the integral intensity of a (200) face as relative to that of a (111) face as measured by X-ray diffractiometry. If $I_{(200)}/I_{(111)}$ is smaller than 4.6, the (100) orientation cannot be regarded as being "dominant" and the sputtering rate will deteriorate. Therefore, the fcc metal that can be sputtered with high rate should satisfy the following relation:

$$I_{(200)}/I_{(111)} \geq 4.6.$$

Matrix

Among the fcc metals described above, those having a Cu matrix have particularly good electromigration characteristics. Therefore, the fcc metals of the invention have preferably a Cu matrix.

Purity

The purity of the Cu in the matrix has a great effect on the microstructure of the sputter film. If its purity is lower than 6 nines, the crystallinity of the sputter film will deteriorate, causing adverse effects on the electromigration and other characteristics. Therefore, the purity of the Cu is preferably at least 6 nines.

Average crystal grain size

With crystals having coarse average grain sizes, the sputtering rate, film uniformity and other characteristics will deteriorate. The deterioration becomes noticeable if the average crystal grain size exceeds 200 μm. Therefore, the average crystal grain size is preferably no more than 200 μm.

Final heat treatment (1) In order to produce fcc metals having random orientations, it is necessary to perform a so-called full annealing which is accompanied by recrystallization. Particularly in the case where the matrix of fcc metals is composed of Cu, recrystallization will not proceed fully if the heat treatment is performed at temperatures lower than 493 K or for periods shorter than 60 seconds. On the other hand, if the heat treatment is performed at temperatures higher than 823 K or for periods longer than 7,200 seconds, not only diseconomy but also coarse crystal grains will occur. Therefore, the heat treatment should be performed at a temperature of 493–823 K for a period of 60–7,200 seconds in order to produce a fcc metal having random orientations.

(2) In order to produce fcc metals having a dominant (110) orientation, it is necessary to perform so-called stress relief annealing which is not accompanied by recrystallization. Particularly in the case where the matrix of fcc metals is composed of Cu, satisfactory stress relief is not accomplished if the heat treatment is performed at temperatures lower than 348 K or for periods shorter than 300 seconds. On the other hand, if the heat treatment is performed at temperatures higher than 473 K or for periods longer than 36,000 seconds, not only diseconomy but also recrystallization will occur. Therefore, the heat treatment should be performed at a temperature of 348–473 K for a period of 300–36,000 seconds in order to produce a fcc metal having a dominant (110) orientation.

(3) In order to produce fcc metals having a dominant (100) orientation, it is necessary to perform a so-called full annealing which is accompanied by recrystallization. Particularly in the case where the matrix of fcc metals is composed of Cu, recrystallization will not proceed fully if the heat treatment is performed at temperatures lower than 493 K or for periods shorter than 60 seconds. On the other hand, if the heat treatment is performed at temperatures higher than 823 K or for periods longer than 7,200 seconds, not only diseconomy but also coarse crystal grains will occur. Therefore, the heat treatment should be performed at a temperature of 493–823 K for a period of 60–7,200 seconds in order to produce a fcc metal having a dominant (100) orientation.

Final working (1) In order to produce fcc metals having random orientations, it is necessary to perform cross rolling. If the total offset of the rolling axis in cross rolling is less than 90°, the aggregation of the (100) faces becomes unduly great; on the other hand, if the total draft that is achieved in cross rolling is less than 20%, the aggregation of the (110) faces is unduly great and whichever the case, the desired random orientations are not achieved. In addition, if the offset of the rolling axis in each pass is less than 15°, the total number of passes that are necessary in the rolling operation will increase to an uneconomical level. Therefore, the final working necessary for producing a fcc metal having random orientations is a so-called cross rolling which is performed to achieve a total draft of at least 20%, with the rolling axis being offset at 15° or more in each pass to a total offset of at least 90°.

(2) In order to produce fcc metals having a dominant (110) orientation, it is also necessary to perform cross rolling. If the total offset of the rolling axis in cross rolling is less than 90° or if the total draft that is achieved in cross rolling is less than 20%, the aggregation of (110) faces becomes unduly small. In addition, if the offset of the rolling axis in each pass is less than 15°, the total number of passes that are necessary in the rolling operation will increase to an uneconomical level. Therefore, the final working necessary for producing a fcc metal having a dominant (110) orientation is so-called cross rolling which is performed to achieve a total draft of at least 20%, with the rolling axis being offset at 15° or more in each pass to a total offset of at least 90°.

(3) In order to produce fcc metals having a dominant (100) orientation, it is necessary to perform one-way rolling. If the total offset of the rolling axis is 15° or more or if the total draft that is achieved by the rolling operation is less than 20%, the aggregation of (100) faces becomes unduly small. Therefore, the final working necessary for producing a fcc metal having a dominant (100) orientation is one-way or reciprocal rolling which is performed to a total draft of at least 20%, with the offset of the rolling axis for all passes being to be less than ±15°.

Working and heat treatments prior to the final working

The working and heat treatments to be performed prior to the final working should comprise hot working that is performed at 623–873 K to a reduction ratio of at least 20% and which is followed at least two performances each of cold working to a reduction ratio of at least 10% and a heat treatment which is performed at 493–823 K for 60–7,200 seconds. If these conditions are not met, the final structure of the fcc metal that is produced will comprise mixed crystals and controlling the average crystal grain size to be no more than 200 $\mu$m is difficult to achieve no matter how dexterous the final working and heat treatments will be.

The fcc metals thus produced with controlled crystal orientations are suitable for use not only as constituent materials for various electric and electronic parts but also as sputtering target materials.

The following examples are provided for the purpose of further illustrating the present invention but they are in no way to be taken as limiting.

Sputtering target materials were produced by the processes described below and their characteristics were evaluated.

EXAMPLE 1

A high-purity (7 N) copper ingot measuring 265×265×60$^t$ mm was worked to dimensions of 320×320×42$^t$ mm by hot cross rolling at 723 K. The total draft achieved in this step was about 30%. The top and bottom surfaces of the hot rolled plate were each cut by 1 mm to dimensions of 320×320×40$^t$ mm.

The cut plate was worked to dimensions of 380×380×34$^t$ mm by one-way cold rolling. The total draft achieved in this step was about 15%.

The cold rolled plate was subjected to a heat treatment at 673 K for 3,600 seconds.

The heat treated plate was worked to dimensions of 380×380×29$^t$ mm by one-way cold rolling with the rolling axis offset by 90° from the previous cold rolling step. The total draft achieved in this step was about 15%.

The cold rolled plate was subjected to a heat treatment at 673 K for 3,600 seconds.

The heat treated plate was worked to dimensions of 450×450×20$^t$ mm by cold cross rolling. By each pass, the rolling axis was offset at 90°. The total draft that was achieved in this step was about 30%.

The cold rolled plate was subjected to a heat treatment at 623 K for 1,200 seconds.

The heat treated plate was cut to a sputtering material in a disk form measuring 400 mm$\phi$×15$^t$ mm.

EXAMPLE 2

A high-purity (6 N) copper ingot measuring 265×265×60$^t$ mm was worked to dimensions of 320×320×42$^t$ m by hot cross rolling at 723 K. The total draft achieved in this step was about 30%.

The top and bottom surfaces of the hot rolled plate were each cut by 1 mm to dimensions of 320×320×40$^t$ mm The cut plate was worked to dimensions of 380×320×34$^t$ mm by one-way cold rolling. The total draft achieved in this step was about 15%.

The cold rolled plate was subjected to a heat treatment at 673 K for 3,600 seconds.

The heat treated plate was worked to dimensions of 380×380×29$^t$ mm by one-way cold rolling, with the rolling axis offset by 90° from the previous cold rolling step. The total draft achieved in this step was about 15%.

The cold rolled plate was subjected to a heat treatment at 673 K for 3,600 seconds.

The heat treated plate was worked to dimensions of 450×450×20$^t$ mm by cold cross rolling, with the rolling axis rotated by about 90° in each pass. The total draft achieved in this step was about 30%.

The cold rolled plate was subjected to a heat treatment at 623 K for 1,200 seconds.

The heat treated plate was cut to a sputtering material in a disk form measuring 400 mmφ×15$^t$ mm.

COMPARATIVE EXAMPLE 1

A high-purity (7 N) copper ingot measuring 265×265×60$^t$ mm was worked to dimensions of 380×265×42$^t$ mm by one-way cold rolling. The total draft achieved in this step was about 30%.

The thus cold rolled plate was worked to dimensions of 380×320×29$^t$ mm by one-way cold rolling with the rolling axis offset by 90° from the preceding cold rolling step. The total draft achieved in this step was about 30%.

The thus cold rolled plate was subjected to a heat treatment at 673 K for 3,600 seconds.

The thus heat treated plate was worked to dimensions of 450×450×20$^t$ mm by cold cross rolling, with the rolling axis rotated by 90° in each pass. The total draft achieved in this step was about 30%.

The thus cold rolled plate was subjected to a heat treatment at 623 K for 1,200 seconds.

The thus heat treated plate was cut to a sputtering target material in a disk form measuring 400 mmφ×15$^t$ mm.

COMPARATIVE EXAMPLE 2

A high-purity (7 N) copper ingot measuring 265×265×60$^t$ mm was worked to dimensions of 320×320×42$^t$ mm by hot cross rolling at 723 K. The total draft achieved in this step was about 30%.

The top and bottom surfaces of the hot rolled plate were each cut by 1 mm to dimensions of 320×320×40$^t$ mm.

The cut plate was worked to dimensions of 380×320×34$^t$ mm by one-way cold rolling. The total draft achieved in this step was about 15%.

The cold rolled plate was subjected to a heat treatment at 673 K for 3,600 seconds.

The heat treated plate was worked to dimensions of 380×380×29$^t$ mm by one-way cold rolling, with the rolling axis offset by 90° from the previous cold rolling step. The total draft achieved in this step was about 15%.

The cold rolled plate was subjected to a heat treatment at 673 K for 3,600 seconds.

The heat treated plate was worked to 450×380×24$^t$ mm by one-way cold rolling. The total draft achieved in this step was about 17%.

The cold rolled plate was subjected to a heat treatment at 623 K for 1,200 seconds.

The heat treated plate was worked to dimensions of 450×450×20$^t$ mm by one-way cold rolling with the rolling axis offset by 90° from the previous cold rolling step. The total draft achieved in this step was about 15%.

The cold rolled plate was subjected to a heat treatment at 623 K for 1,200 seconds.

The heat treated plate was cut to a sputtering target material in a disk form measuring 400 mmφ×15$^t$ mm.

The four sputtering target materials thus produced were measured for their Cu matrix purity, crystal grain size and crystal orientations. The results are shown in Table 1 below.

TABLE 1

|  | Purity of Cu, wt % | Average crystal grain size, μm | $I_{(200)}/I_{(111)}$ | $I_{(220)}/I_{(111)}$ |
|---|---|---|---|---|
| Example 1 | 99.99996 | 134 | 1.8 | 0.7 |
| Example 2 | 99.99991 | 121 | 2.1 | 0.4 |
| Comparative Example 1 | 99.99997 | 307 | 1.1 | 1.0 |
| Comparative Example 2 | 99.99996 | 170 | 3.3 | 1.9 |

The sputtering target material produced by Example 1 and the aluminum target currently used as a material for producing metallization films on substrate wafers by sputtering were sputtered to form conductor films and their electromigration characteristics were evaluated in terms of median energy to failure (MEF) as determined by the BEM (breakdown energy of metals) method. The results are shown in Table 2 together with the purity, average crystal grain size and crystal orientation data for the aluminum target.

TABLE 2

|  | Purity, wt % | Average crystal grain size, μm | $I_{(200)}/I_{(111)}$ | $I_{(220)}/I_{(111)}$ | MEF, mJ/cm |
|---|---|---|---|---|---|
| Example 1 | Cu99.99996 | 134 | 1.8 | 0.7 | 216 |
| Al target | Al99.996 | 540 | 4.3 | 1.5 | 47 |

EXAMPLE 3

A high-purity (7 N) copper ingot measuring 265×265×60$^t$ mm was worked to dimensions of 320×320×42$^t$ mm by hot cross rolling at 723 K. The total draft achieved in this step was about 30%. The top and bottom surfaces of the hot rolled plate were each cut by 1 mm to dimensions of 320×320×40$^t$ mm.

The cut plate was worked to dimensions of 380×320×34$^t$ mm by one-way cold rolling. The total draft achieved in this step was about 15%.

The cold rolled plate was subjected to a heat treatment at 673 K for 3,600 seconds.

The heat treated plate was worked to dimensions of 380×380×29$^t$ mm by one-way cold rolling with the rolling axis offset by 90° from the previous cold rolling step. The total draft achieved in this step was about 15%.

The cold rolled plate was subjected to a heat treatment at 673 K for 3,600 seconds.

The heat treated plate was worked to dimensions of 450×450×20$^t$ mm by cold cross rolling. By each pass, the rolling axis was offset at 90°. The total draft that was achieved in this step was about 30%.

The cold rolled plate was subjected to a heat treatment at 373 K for 3,600 seconds.

The heat treated plate was cut to a sputtering material in a disk form measuring 400 mmφ×15$^t$ mm.

EXAMPLE 4

A high-purity (6 N) copper ingot measuring 265×265×60$^t$ mm was worked to dimensions of 320×320×42$^t$ mm by hot cross rolling at 723 K. The total draft achieved in this step was about 30%.

The top and bottom surfaces of the hot rolled plate were each cut by 1 mm to dimensions of 320×320×40$^t$ mm.

The cut plate was worked to dimensions of 380×320×34$^t$ mm by one-way cold rolling. The total draft achieved in this step was about 15%.

The cold rolled plate was subjected to a heat treatment at 673 K for 3,600 seconds.

The heat treated plate was worked to dimensions of 380×380×29$^t$ mm by one-way cold rolling, with the rolling axis offset by 90° from the previous cold rolling step. The total draft achieved in this step was about 15%.

The cold rolled plate was subjected to a heat treatment at 673 K for 3,600 seconds.

The heat treated plate was worked to dimensions of 450×450×20$^t$ mm by cold cross rolling, with the rolling axis rotated by 90° in each pass. The total draft achieved in this step was about 30%.

The cold rolled plate was subjected to a heat treatment at 373 K for 3,600 seconds.

The heat treated plate was cut to a sputtering material in a disk form measuring 400 mmϕ×15$^t$ mm.

COMPARATIVE EXAMPLE 1

A high-purity (7 N) copper ingot measuring 265×265×60$^t$ mm was worked to dimensions of 380×265×42$^t$ mm by one-way cold rolling. The total draft achieved in this step was about 30%.

The thus cold rolled plate was worked to dimensions of 380×320×29$^t$ mm by one-way cold rolling with the rolling axis offset by 90° from the preceding cold rolling step. The total draft achieved in this step was about 30%.

The thus cold rolled plate was subjected to a heat treatment at 673 K for 3,600 seconds.

The thus heat treated plate was worked to dimensions of 450×450×20$^t$ mm by cold cross rolling, with the rolling axis rotated by 90° in each pass. The total draft achieved in this step was about 30%.

The thus cold rolled plate was subjected to a heat treatment at 623 K for 1,200 seconds.

The thus heat treated plate was cut to a sputtering target material in a disk form measuring 400 mmϕ×15$^t$ mm.

COMPARATIVE EXAMPLE 4

A high-purity (7 N) copper ingot measuring 265×265×60$^t$ mm was worked to dimensions of 320×320×42$^t$ mm by hot cross rolling at 723 K. The total draft achieved in this step was about 30%.

The top and bottom surfaces of the hot rolled plate were each cut by 1 mm to dimensions of 320×320×40$^t$ mm.

The cut plate was worked to dimensions of 380×320×34$^t$ mm by one-way cold rolling. The total draft achieved in this step was about 15%.

The cold rolled plate was subjected to a heat treatment at 673 K for 3,600 seconds.

The heat treated plate was worked to dimensions of 380×380×29$^t$ mm by one-way cold rolling, with the rolling axis offset by 90° from the previous cold rolling step. The total draft achieved in this step was about 15%.

The cold rolled plate was subjected to a heat treatment at 673 K for 3,600 seconds.

The heat treated plate was worked to dimensions of 450×380×24$^t$ mm by one-way cold rolling. The total draft achieved in this step was about 17%.

The cold rolled plate was subjected to a heat treatment at 623 K for 1,200 seconds.

The heat treated plate was worked to dimensions of 450×450×24$^t$ mm by one-way cold rolling with the rolling axis offset by 90° from the previous cold rolling step. The total draft achieved in this step was about 15%.

The cold rolled plate was subjected to a heat treatment at 373 K for 3,600 seconds.

The heat treated plate was cut to a sputtering target material in a disk form measuring 400 mmϕ×15$^t$ mm.

The four sputtering target materials thus produced were measured for their Cu matrix purity, crystal grain size and crystal orientations. The results are shown in Table 3 below.

TABLE 3

|  | Purity of Cu, wt % | Average crystal grain size, μm | $I_{(200)}/I_{(111)}$ | $I_{(220)}/I_{(111)}$ |
|---|---|---|---|---|
| Example 3 | 99.99996 | 95 | 2.7 | 3.3 |
| Example 4 | 99.99992 | 132 | 2.4 | 2.6 |
| Comparative Example 3 | 99.99993 | 280 | 3.1 | 3.5 |
| Comparative Example 4 | 99.99992 | 181 | 2.9 | 1.4 |

The sputtering target material produced by Example 3 and the aluminum target currently used as a material for producing metallization films on substrate wafers by sputtering were sputtered to form conductor films and their electromigration characteristics were evaluated in terms of median energy to failure (MEF) as determined by the BEM (breakdown energy of metals) method. The results are shown in Table 4 together with the purity, average crystal grain size and crystal orientation data for the aluminum target.

TABLE 4

|  | Purity, wt % | Average crystal grain size, μm | $I_{(200)}/I_{(111)}$ | $I_{(220)}/I_{(111)}$ | MEF, mJ/cm |
|---|---|---|---|---|---|
| Example 3 | Cu99.99996 | 95 | 2.7 | 3.3 | 189 |
| Al target | Al99.996 | 540 | 4.3 | 1.5 | 47 |

Obviously, the sputtering target material produced by the present invention has better electromigration characteristics than the aluminum target which is currently used as a material for producing metallization films by sputtering on substrate wafers and, in addition, the product of the invention has optimal levels of purity, crystal grain size and crystal orientations, which make it particularly suitable or use as a sputtering target material.

EXAMPLE 5

A high-purity (7 N) copper ingot measuring 265×265×60$^t$ mm was worked to dimensions of 320×320×42$^t$ mm by hot cross rolling at 723 K. The total draft achieved in this step was about 30%. The top and bottom surfaces of the hot rolled plate were each cut by 1 mm to dimensions of 320×320×40$^t$ mm.

The cut plate was worked to dimensions of 380×320×34$^t$ mm by one-way cold rolling. The total draft achieved in this step was about 15%.

The cold rolled plate was subjected to a heat treatment at 673 K for 3,600 seconds.

The heat treated plate was worked to dimensions of 450×320×29$^t$ mm by one-way cold rolling with the rolling axis being kept equal to that in the previous cold rolling step. The total draft achieved in this step was about 15%.

The cold rolled plate was subjected to a heat treatment at 673 K for 3,600 seconds.

The heat treated plate was worked to dimensions of 450×450×20$^t$ mm by one-way cold rolling with the rolling axis offset by 90° from the previous cold rolling step. The total draft that was achieved in this step was about 30%.

The cold rolled plate was subjected to a heat treatment at 623 K for 1,200 seconds.

The heat treated plate was cut to a sputtering material in a disk form measuring 400 mmφ×15$^t$ mm.

EXAMPLE 6

A high-purity (6 N) copper ingot measuring 265×265×60$^t$ mm was worked to dimensions of 320×320×42$^t$ mm by hot cross rolling at 723 K. The total draft achieved in this step was about 30%.

The top and bottom surfaces of the hot rolled plate were each cut by 1 mm to dimensions of 320×320×40$^t$ mm.

The cut plate was worked to dimensions of 380×320×34$^t$ mm by one-way cold rolling. The total draft achieved in this step was about 15%.

The cold rolled plate was subjected to a heat treatment at 673 K for 3,600 seconds.

The heat treated plate was worked to dimensions of 450×320×29$^t$ mm by one-way cold rolling, with the rolling axis being set equal to that in the previous cold rolling step. The total draft achieved in this step was about 15%.

The cold rolled plate was subjected to a heat treatment at 673 K for 3,600 seconds.

The heat treated plate was worked to dimensions of 450×450×20$^t$ mm by one-way cold rolling, with the rolling axis offset by about 90° from the previous cold rolling step. The total draft achieved in this step was about 30%.

The cold rolled plate was subjected to a heat treatment at 623 K for 1,200 seconds.

The heat treated plate was cut to a sputtering material in a disk form measuring 400 mmφ×15$^t$ mm.

COMPARATIVE EXAMPLE 5

A high-purity (7 N) copper ingot measuring 265×265×60$^t$ mm was worked to dimensions of 320×320×42$^t$ mm by cold cross rolling. The total draft achieved in this step was about 30%.

The top and bottom surfaces of the cold rolled plate were each cut by 1 mm to dimensions of 320×320×40$^t$ mm.

The cuts plate was worked to dimensions of 380×320×34$^t$ mm by one-way cold rolling. The total draft achieved in this step was about 15%.

The thus cold rolled plate was subjected to a heat treatment at 673 K for 3,600 seconds.

The thus heat treated plate was worked to dimensions of 450×320×29$^t$ mm by one-way cold rolling, with the rolling axis being kept equal to that in the previous cold rolling step. The total draft achieved in this step was about 15%.

The thus cold rolled plate was subjected to a heat treatment at 673 K for 3,600 seconds.

The thus heat treated plate was worked to dimensions of 450×450×20$^t$ mm by one-way cold rolling, with the rolling axis offset by 90° from the previous cold rolling step. The total draft achieved in this step was about 30%.

The thus cold rolled plate was subjected to a heat treatment at 623 K for 1,200 seconds.

The thus heat treated plate was cut to a sputtering target material in a disk form measuring 400 mmφ×15$^t$ mm.

COMPARATIVE EXAMPLE 6

A high-purity (7 N) copper ingot measuring 265×265×60$^t$ mm was worked to dimensions of 320×320×42$^t$ mm by cold cross rolling at 723 K. The total draft achieved in this step was about 30%.

The top and bottom surfaces of the hot rolled plate were each cut by 1 mm to dimensions of 320×320×40$^t$ mm.

The cut plate was worked to dimensions of 380×320×34$^t$ mm by one-way cold rolling. The total draft achieved in this step was about 15%.

The cold rolled plate was subjected to a heat treatment at 673 K for 3,600 seconds.

The heat treated plate was worked to dimensions of 380×380×29$^t$ mm by one-way cold rolling, with the rolling axis offset by 90° from the previous cold rolling step. The total draft achieved in this step was about 15%.

The cold rolled plate was subjected to a heat treatment at 673 K for 3,600 seconds.

The heat treated plate was worked to 450×380×24$^t$ mm by one-way cold rolling. The total draft achieved in this step was about 17%.

The cold rolled plate was subjected to a heat treatment at 623 K for 1,200 seconds.

The heat treated plate was worked to dimensions of 450×450×20$^t$ mm by one-way cold rolling with the rolling axis offset by 90° from the previous cold rolling step. The total draft achieved in this step was about 15%.

The cold rolled plate was subjected to a heat treatment at 623 K for 1,200 seconds.

The heat treated plate was cut to a sputtering target material in a disk form measuring 400 mmφ×15$^t$ mm.

The four sputtering target materials thus produced were measured for their Cu matrix purity, crystal grain size and crystal orientations. The results are shown in Table 5 below.

TABLE 5

|  | Purity of Cu, wt % | Average crystal grain size, μm | $I_{(200)}/I_{(111)}$ | $I_{(220)}/I_{(111)}$ |
| --- | --- | --- | --- | --- |
| Example 5 | 99.99998 | 141 | 5.8 | 0.6 |
| Example 6 | 99.99992 | 110 | 4.7 | 0.5 |
| Comparative Example 5 | 99.99994 | 325 | 6.0 | 0.9 |
| Comparative Example 6 | 99.99993 | 164 | 3.1 | 1.7 |

The sputtering target material produced by Example 5 and the aluminum target currently used as a material for producing metallization films on substrate wafers by sputtering were sputtered to form conductor films and their electromigration characteristics were evaluated in terms of median energy to failure (MEF) as determined by the BEM (breakdown energy of metals) method. The results are shown in Table 6 together with the purity, average crystal grain size and crystal orientation data for the aluminum target.

TABLE 6

|  | Purity, wt % | Average crystal grain size, μm | $I_{(200)}/I_{(111)}$ | $I_{(220)}/I_{(111)}$ | MEF, mJ/cm |
|---|---|---|---|---|---|
| Example 6 | Cu99.99998 | 145 | 5.8 | 0.6 | 285 |
| Al target | Al99.996 | 540 | 4.3 | 1.5 | 47 |

Obviously, the sputtering target material produced by the present invention has better electromigration characteristics than the aluminum target which is currently used as a material for producing metallization films by sputtering on substrate wafers and, in addition, the product of the invention has optimal levels of purity, crystal grain size and crystal orientations, which make it particularly suitable or use as a sputtering target material.

What is claimed is:

1. A process for producing a fcc metal consisting of copper having random orientations comprising cross rolling a metal containing copper, which is performed to achieve a total draft of at least 20%, with the rolling axis being offset at 15° or more in each pass to a total offset of at least 90°, and subsequent full annealing which is accompanied by recrystallization, said fcc metal satisfying the relations:

$I_{(200)}/I_{(111)} \leq 2.3$ and $I_{(220)}/I_{(111)} \leq 1.0$ where (111), I(200) and (220) are the integral intensities of (111), (200) and (220) faces, respectively, of crystal faces as measured by X-ray diffractiometry.

2. A process for producing a fcc metal consisting of copper and having random orientations comprising cross rolling a metal containing copper, which is performed to achieve a total draft of at least 20%, with the rolling axis being offset at 15° or more in each pass to a total offset of at least 90°, and subsequent heat treatment which is performed at 493–823 K for 60–7,200 seconds, said fcc metal satisfying the relations:

$I_{(200)}/I_{(111)} \leq 2.3$ and $I_{(220)}/I_{(111)} \leq 1.0$ where $I_{(111)}$, $I_{(200)}$ and $I_{(220)}$ are the integral intensities of (111), (200) and (220) faces, respectively, of crystal faces as measured by X-ray diffractiometry.

3. A process for producing a fcc metal according to claim 2, wherein the copper has a purity of at least 99.9999%.

4. A process for producing a fcc metal according to claim 2, said fcc metal having an average crystal grain size of no more than 200 μm and random orientations, said process comprising the hot working at metal containing copper at 623–873 K to a reduction ratio of at least 20%, performing at least twice each of cold working to a reduction ratio of at least 10% and a heat treatment at 493–823 K for 60–7,200 seconds followed by cross rolling which is performed to achieve a total draft of at least 20%, with the rolling axis being off set at 15° or more on each pass to a draft offset of at least 90° and subsequent heat treatment which is performed at 493–823 K for 60–7,200 seconds.

5. A process for producing a fcc metal consisting of copper having a dominant (110) orientation comprising cross rolling a metal containing copper which is performed to achieve a total draft of at least 20%, with the rolling axis being offset at 15° or more in each pass to a total offset of at least 90°, and subsequent stress-relief annealing which is not accompanied by recrystallization, said fcc metal satisfying the relations:

$I_{(220)}/I_{(111)} \geq 2.0$ where $I_{(111)}$ and $I_{(220)}$ are the integral intensities of (111) and (220) faces, respectively, of crystal faces as measured by X-ray diffractiometry.

6. A process for producing a fcc metal according to claim 5, said fcc metal consisting of copper and having a dominant (110) orientation, said process comprising cross rolling a metal containing copper, which is performed to achieve a total draft of at least 20%, with the rolling axis being offset at 15° or more in each pass to a total offset of at least 90°, and subsequent heat treatment which is performed at 348–473 K for 300–36,000 seconds.

7. A process for producing a fcc metal according to claim 6, wherein the copper has a purity of at least 99.9999%.

8. A process for producing a fcc metal according to claim 5, said fcc metal having an average crystal grain size of no more than 200 μm and a dominant (110) orientation, said process comprising hot working a metal containing copper at 623–873 K to a reduction ratio of at least 20%, performing at least twice each of cold working to a reduction ratio of at least 10% and a heat treatment at 493–823 K for 60–7,200 seconds and cross rolling which is performed to achieve a total draft of at least 20%, with the rolling axis being offset at 15° or more in each pass to a total offset of at least 90°, and subsequent heat treatment which is performed at 348–473 K for 300–36,000 seconds.

9. A process for producing a fcc metal consisting of copper having an average crystal grain size of no more than 200 μm and a dominant (100) orientation, said process comprising (a) hot working a metal containing copper at a temperature of 623 to 873° K to a reduction ratio of at least 20%, (b) performing at least twice each of a cold working to a reduction ratio of at least 10% and a heat treatment at a temperature of 493 to 823° K for 60–7,200 seconds, (c) one-way or reciprocal rolling which is performed to a total draft of at least 20%, with an offset of the rolling axis for all passes being controlled to be less than ±15° and (d) carrying out a heat treatment at a temperature of 493 to 823° K for 60–7,200 seconds, said fcc metal satisfying the relationship:

$I_{(200)}/I_{(111)} \geq 4.6$ wherein $I_{(111)}$ and $I_{(200)}$ are the integral intensities of (111) and (200) faces, respectively, of crystal faces as measured by X-ray diffractiometry.

10. A process for producing a fcc metal according to claim 9, wherein the copper has a purity of at least 99.9999%.

* * * * *